US010180503B2

(12) United States Patent
Ouspenski et al.

(10) Patent No.: US 10,180,503 B2
(45) Date of Patent: Jan. 15, 2019

(54) FABRICATION OF A SCINTILLATOR MATERIAL OF ELPASOLITE TYPE

(71) Applicant: Saint-Gobain Cristaux Et Detecteurs, Courbevoie (FR)

(72) Inventors: Vladimir Ouspenski, Saint-Pierre les Nemours (FR); Samuel Blahuta, Fontenay-sous-Bois (FR); Raphaël Huchet, Montgeron (FR); Julien Lejay, Rueil Malmaison (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 0 days.

(21) Appl. No.: 15/960,061

(22) Filed: Apr. 23, 2018

(65) Prior Publication Data

US 2018/0246230 A1 Aug. 30, 2018

Related U.S. Application Data

(63) Continuation of application No. 15/418,396, filed on Jan. 27, 2017, now Pat. No. 9,983,318, which is a
(Continued)

(30) Foreign Application Priority Data

Apr. 12, 2013 (FR) ..................... 13 53354

(51) Int. Cl.
*H05B 33/00* (2006.01)
*G01T 1/202* (2006.01)
(Continued)

(52) U.S. Cl.
CPC ........ *G01T 1/2023* (2013.01); *C09K 11/7766* (2013.01); *C09K 11/7773* (2013.01);
(Continued)

(58) Field of Classification Search
CPC ......... G01T 3/06; G01T 1/202; G01T 1/2006; G01T 1/2023
See application file for complete search history.

(56) References Cited

U.S. PATENT DOCUMENTS

| 6,228,286 B1 | 5/2001 | Leblans et al. |
| 7,332,028 B2 | 2/2008 | Itlis et al. |
| (Continued) | | |

FOREIGN PATENT DOCUMENTS

| EP | 685548 A1 | 3/1995 |
| JP | H07-331240 A | 12/1995 |
| (Continued) | | |

OTHER PUBLICATIONS

Shirwadkar, U., et al., "Novel Scintillation Material Cs2LiLaBr6-xClx:Ce for Gamma-ray and Neutron Spectroscopy," IEEE Nuclear Science Sumposium and Medical Imaging Conference Record (NSS/MIC), 2012, pp. 1963-1967, XP055125390.
(Continued)

*Primary Examiner* — Kiho Kim
(74) *Attorney, Agent, or Firm* — Abel Law Group, LLP

(57) ABSTRACT

The present disclosure relates to a process for fabricating a crystalline scintillator material with a structure of elpasolite type of theoretical composition $A_2BC_{(1-y)}M_yX_{(6-y)}$ wherein:
A is chosen from among Cs, Rb, K, Na,
B is chosen from among Li, K, Na,
C is chosen from among the rare earths, Al, Ga,
M is chosen from among the alkaline earths,
X is chosen from among F, Cl, Br, I,
y representing the atomic fraction of substitution of C by M and being in the range extending from 0 to 0.05, comprising its crystallization by cooling from a melt bath comprising r moles of A and s moles of B, the melt bath in contact with the material containing A and B in such a way that 2s/r is above 1. The process shows an improved fabrication yield.
(Continued)

Moreover, the crystals obtained can have compositions closer to stoichiometry and have improved scintillation properties.

20 Claims, 1 Drawing Sheet

Related U.S. Application Data continuation of application No. 14/879,650, filed on Oct. 9, 2015, now Pat. No. 9,599,727, which is a continuation-in-part of application No. PCT/FR2014/050893, filed on Apr. 11, 2014.

(51) Int. Cl.

| | | |
|---|---|---|
| C30B 11/00 | (2006.01) | |
| C30B 15/00 | (2006.01) | |
| C30B 29/12 | (2006.01) | |
| C09K 11/77 | (2006.01) | |
| C30B 11/02 | (2006.01) | |
| C30B 11/04 | (2006.01) | |
| C30B 15/04 | (2006.01) | |

(52) U.S. Cl.
CPC .............. *C30B 11/00* (2013.01); *C30B 11/02* (2013.01); *C30B 11/04* (2013.01); *C30B 15/00* (2013.01); *C30B 15/04* (2013.01); *C30B 29/12* (2013.01)

(56) References Cited

U.S. PATENT DOCUMENTS

| | | | |
|---|---|---|---|
| 7,335,891 B2 | 2/2008 | Kniss et al. | |
| 7,525,100 B2 | 4/2009 | Kraemer et al. | |
| 7,608,201 B2 | 10/2009 | Iltis | |
| 7,655,919 B1 | 2/2010 | Shah et al. | |
| 7,670,578 B2 | 3/2010 | Iltis | |
| 7,767,975 B2 | 3/2010 | Flamanc et al. | |
| 7,847,262 B1 | 12/2010 | Shah et al. | |
| 7,910,894 B2 | 3/2011 | Kraemer et al. | |
| 7,939,808 B1 | 5/2011 | Shah et al. | |
| 7,977,645 B1 | 7/2011 | Shah et al. | |
| 8,021,636 B2 | 9/2011 | Iltis | |
| 8,242,452 B1 | 8/2012 | Shah et al. | |
| 8,252,260 B2 | 8/2012 | Iltis | |
| 8,362,439 B1 | 1/2013 | Shah et al. | |
| 8,440,980 B2 | 5/2013 | Shah et al. | |
| 8,575,553 B1 | 11/2013 | Shah et al. | |
| 8,586,935 B2 | 11/2013 | Shah et al. | |
| 8,969,824 B2 | 3/2015 | Shah et al. | |
| 2005/0196545 A1* | 9/2005 | Ando | C09K 11/02 427/446 |
| 2007/0029493 A1* | 2/2007 | Kniss | G01T 3/06 250/370.11 |
| 2008/0131347 A1* | 6/2008 | Srivastava | C09K 11/7705 423/263 |
| 2011/0024635 A1 | 2/2011 | Shah et al. | |
| 2013/0087712 A1* | 4/2013 | Szupryczynski | G21K 4/00 250/366 |
| 2013/0126741 A1 | 5/2013 | Srivastava | |

FOREIGN PATENT DOCUMENTS

| | | |
|---|---|---|
| JP | 2007-503501 A | 2/2007 |
| WO | 2005/021680 A1 | 3/2005 |
| WO | 2011066292 A1 | 6/2011 |
| WO | 2013041251 A2 | 3/2013 |

OTHER PUBLICATIONS

Aull, B., et al., "Impact of ion-host interactions on the 5d-to-4f spectra of lanthanide rare-earth-metal ions. II. The Cedoped elpasolites," The American Physical Society, Physical Review B, vol. 34, No. 10, Nov. 15, 1986, pp. 6647-6655, XP002475697.

Higgins, William M., et al., "Bridgman growth of Cs2LiYCl6:Ce and 6Li-enriched Cs6/2LiYCL6:Ce Crystals for high resolution gamma ray and neutron spectrometers," Journal of Crystal Growth, vol. 312, 2010, pp. 1216-1220, XP002719526.

Shirwadkar, U., et al., "Scintillation properties of Cs2LiLABr6 (CLLB) crystals with varying Ce3+ concentration," Nuclear Instruments and Methods in Physics Research A, vol. 652, 2011, pp. 268-270, XP002719527.

Glodo, J., et al., "Dual Gamma Neutron Detection with Cs2LiLaCl6," Hard X-ray, Gamma-ray, and Neutron Detector Physics, eds Ralph B. James, Larry A. Franks, Arnold Burger, Proc of SPIE Vo. 7449, 74490E, 2009, 7 pgs., XP002719563.

Tanner, Peter, A. et al. "Absorption and Emission Spectra of Ce3+ in Elpasolite Lattices," Journal of the American Chem Society, 2003, vol. 125, pp. 13225-13233, XP002719564.

Reber, Christina, et al., "Optical Spectroscopic and Structural Properties of V3+-Doped Fluoride, Chloride, and Bromide Elpasolite Lattices," Inorganic Chemistry, vol. 28, No. 16, 1989, 28 pp. 3249-3258, XP-002719565.

Aull, Brian Francis, "The Impact of Ion-Host Interactions on the 5d-to-4f spectra of Lanthanide Rare Earth Ions," Massachusetts Institute of Technology Jun. 1985, 200 pages, XP008167107.

Glodo, Jarek, et al., "Selected Properties of Cs2LiYCl6, Cs2LiLaCl6, and Cs2LiLaBr6 Scintillators," IEEE Transactions on Nuclear Science, vol. 58, No. 1, Feb. 2011, pp. 333-338, XP011334601.

Glodo, Jarek, et al., "Pulse Shape Discrimination With Selected Elpasolite Crystals," IEEE Transactions on Nuclear Science, vol. 59, No. 5, Oct. 2012, pp. 2328-2333, XP011467412.

S. Mroczkowski and Paul Dorain, "Preparation of Rb2NaYF6:Ce3+ and Cs2NaYF6:Ce3+—A Prospect for Tunable Lasers in the Blue-Green Wavelenghr," Journal of the Less-Common Metals, 110 (1985) pp. 259-265 XP024072828.

A.V. Goryunov et al., "Crystal Structure of Lithium and Yttrium Complex Fluorides" Mat. Res. Bull., vol. 27. pp. 312-220, 1992, XP024077860.

Christian Reber and Hans U. Gudel, Near-Infrared Luminescence spectroscopy and Relaxation Behavior of V3+ Doped in Cs2NaYCl6-mBrm (m=0, 0.3, 3, 6) Journal of Luminescence 42 (1988) pp. 1-13 North-Holland, Amsterdam XP024431388.

Combes et al., "Optical and scintillation properties of pure and Ce3+-doped Cs2LiYCl6 and Li3YCl6;Ce3+ crystals," 1999, Journal of Luminescence, pp. 299-305.

Putaj, P., et al., "Optical and Scintillation Properties of the Thermal Neutron Scintillator Li3YCl6:Ce", Transactions on Nuclear Science, vol. 57, No. 3 Jun. 2010.

Van Eijk, et al., "Development of Elpasolite and Monoclinic Thermal Neutron Scintillators", 2005 IEEE Nuclear Science Symposium Conference Record, 5 pgs.

Van Loef, et al., "Optical and Scintillation properties of Cs2LiYCl6:Ce3+ and Cs2LiYCl6:Pr3+ Crystals", 2004, IEEE Nuclear Science Symposium Conference Record, pp. 265-468.

\* cited by examiner

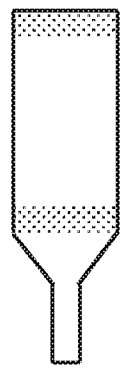  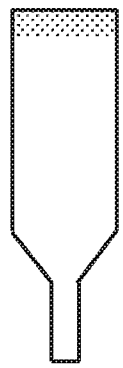
Fig. 1a　　Fig. 1b　　Fig. 1c
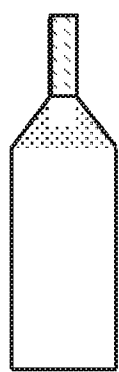 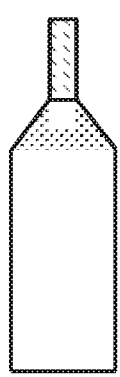 
Fig. 2a　　Fig. 2b　　Fig. 2c

FABRICATION OF A SCINTILLATOR MATERIAL OF ELPASOLITE TYPE

CROSS-REFERENCE TO RELATED APPLICATIONS

The present application is a continuation of and claims priority under 35 U.S.C. § 120 to Ser. No. 15/418,396 entitled "Fabrication of a Scintillator Material of Elpasolite Type" by Vladimir Ouspenski et al., filed Jan. 27, 2017, which is a continuation of and claims priority under 35 U.S.C. § 120 to Ser. No. 14/879,650 entitled "Fabrication of a Scintillator Material of Elpasolite Type" by Vladimir Ouspenski et al., filed Oct. 9, 2015 (now U.S. Pat. No. 9,599,727B2), which is a continuation-in-part of and claims priority to International Application No. PCT/FR2014/050893, entitled "Production of an Elpasolite-Type Scintillator Material" by Vladimir Ouspenski et al., filed Apr. 11, 2014, which claims priority to French Patent Application No. 1353354, entitled "Fabrication D'une Elpasolite Stoechiometrique" by Vladimir Ouspenski et al., filed Apr. 12, 2013, all of which applications are incorporated by reference herein in their entireties.

FIELD OF THE DISCLOSURE

This disclosure generally relates to a crystalline material including an elpasolite phase and a process for fabricating a crystalline material including an elpasolite phase. Particularly, this disclosure relates to a monocrystalline material including a rare earth or metal halide elpasolite phase and a process of forming.

DESCRIPTION OF RELATED ART

Scintillator materials are widely used for detecting gamma or X-rays as well as energetic particles such as alpha particles, neutrons etc.

Scintillation relies on the physical principle of the conversion of the energy of photons, incident X or gamma radiation or energetic particles into light in or near the visible spectrum. Notably, inorganic scintillators are preferably monocrystalline or polycrystalline. A single crystal allows easier extraction of light thanks to the absence of internal diffusion across grain boundaries, heterogeneities and other defects present in polycrystalline materials. A state of good crystallinity is necessary, as it determines the most effective scintillation mechanisms. The extracted light is then collected by a device well known to those skilled in the art as a photomultiplier tube, a photodiode, a SiPM (silicon photomultiplier), an APD (avalanche photodiode) etc. A polycrystalline scintillator can be produced from powders that are compacted, sintered or coated with a binding agent so as to allow extraction of light. Often, these non-monocrystalline materials are too opaque beyond a certain thickness, a thickness that is moreover insufficient to stop enough incident energetic particles or photons. Generally, a monocrystalline scintillator material is preferred. The detection of gamma photons, alpha or beta particles, charged particles or neutrons is of major benefit in many applications in nuclear medicine, fundamental physics, for baggage security scanners (detection portals), the continuous monitoring of containers and trucks at borders, geophysical diagnostic systems in mines and for oil drilling, etc. In these applications, it is moreover often desirable to be able to tell neutrons apart from gamma radiation and a scintillation detector should in this case be able to produce signals of different luminescence characteristics depending on the type of radiation.

The conventional procedure of those skilled in the art seeking to fabricate an elpasolite single crystal is to carry out a crystallization based on a melt bath, the composition of which corresponds to the stoichiometry of the crystal in question. Whatever the process of crystalline growth used, for a large number of complex compositions (three-component or even more complex) the phenomenon of incongruent fusion exists. The crystallization of a main phase of elpasolite is accompanied or preceded by the precipitation of a secondary phase that can appear in the form of inclusions or of a single-phase region of an undesirable phase. It has now been noticed that the crystalline material obtained from the melt bath of these complex compositions contains a high proportion of inclusions, or is even solely composed of the secondary unwanted phase. The crystalline material obtained, of the single-crystal or polycrystal type, can also be called the ingot. In the case of a single crystal made from incongruent fusion, the secondary phase is generally located at the ends or around the perimeter of the monocrystalline material. This secondary phase forms non-transparent regions disturbing the monocrystalline nature of the main phase. In certain favorable cases, it is nonetheless possible to recover part of the monocrystalline material while subsequently eliminating these unusable regions by cutting out and preserving the transparent monocrystalline part that is free of inclusions. These inclusions correspond to unwanted phases of a different composition to that sought. According to this disclosure, a means has been discovered for reducing the proportion of these impure regions, or even in certain cases of eliminating them, and providing better fabrication yields in doing so.

BRIEF DESCRIPTION OF THE DRAWINGS

Embodiments are illustrated by way of example and are not limited by the accompanying figures.

FIGS. 1a to 1c represent ingots taken out of their phial after crystalline growth of Bridgman type.

FIGS. 2a to 2c represent ingots after crystalline growth of Czochralski type.

Skilled artisans appreciate that elements in the figures are illustrated for simplicity and clarity and have not necessarily been drawn to scale. For example, the dimensions of some of the elements in the figures can be exaggerated relative to other elements to help improve understanding of embodiments of the invention. The use of the same reference symbols in different drawings indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes, " "including," "has," "having," or any other variation thereof, are intended to cover a non-exclusive inclusion. For example, a process, method, article, or apparatus that comprises a list of features is not necessarily limited only to those features but can include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this disclosure belongs. The materials, methods, and examples are illustrative only and not intended to be limiting. To the extent not described herein, many details regarding specific materials and processing acts are conventional and can be found in textbooks and other sources within the scintillation and radiation detection arts.

This disclosure provides means for reducing the proportion of impure regions or a secondary phase included in a crystalline material during its growth. In particular cases, formation of impure regions or a secondary phase can be prevented.

In addition to obtaining better fabrication yields, the present disclosure makes it possible to obtain crystals of the composition closer to the theoretical stoichiometry of elpasolite, or even to enrich it in certain cases, notably with certain elements such as Li. Enriching with Li is advantageous for neutron detection. In most cases, a composition closer to the theoretical stoichiometry translates into a better transmission of light and, in scintillation, by a better energy resolution. Moreover, the present disclosure allows the use of the so-called Czochralski growth process, which has until now been considered by those skilled in the art as being impossible for incongruent fusion crystals and in particular the majority of crystals of the elpasolite family. In Bridgman growth, the process according to this disclosure makes it possible to obtain higher material yields of usable crystal, i.e. it leads to an ingot comprising less unwanted phase for an incongruent fusion elpasolite.

This disclosure relates to a process for fabricating a crystalline scintillator material and the crystalline scintillator material itself. In particular, this disclosure relates to a process for fabricating a crystalline scintillator material with a structure of elpasolite type of theoretical composition:

(1)

wherein

A is chosen from among Cs, Rb, K, Na,
B is chosen from among Li, K, Na,
C is chosen from among the rare earths, Al, Ga,
M is chosen from among the alkaline earths, particularly Ca, Mg, Sr, Ba
X is chosen from among F, Cl, Br, I,
y representing the atomic fraction (or molar fraction) of substitution of C by M (the elements C and M occupy the same sites of the elpasolite) and being in the range extending from 0 to 0.05 (which means that y can be zero), comprising its crystallization by cooling from a melt bath comprising r moles of A and s moles of B, the melt bath in contact with the material containing A and B in such a way that 2s/r is above 1.

The above remark does not mean that the crystalline scintillator material actually obtained by the process according to the invention has the theoretical stoichiometric composition. It means that it leads to a crystal, the formula of which would be the formula (1) if its composition was actually theoretical (i.e. stoichiometric).

The formulae of materials actually produced can be determined from elementary analyses (ICP—inductively coupled plasma—or XRF—X-ray fluorescence) of each element (except Li in the case of XRF) and with the convention that the sum of the cations is 4 in the formula of the elpasolite.

The fact that the ratio 2s/r is above 1 is representative of an "excess of B" in the melt bath in the context of the present disclosure. It is in this sense that the expression "excess of B" can be used in the context of the present application. Indeed, the stoichiometric theoretical elpasolite is such that the ratio of the double of the number of moles of B to the number of moles of A is equal to 1. It has now been found that this ratio in the crystal actually produced was in reality below 1, working with a 2s/r of 1, and that it is by increasing the 2s/r ratio related to the melt bath that it is possible to approach and even to reach, or even exceed, the stoichiometric atomic (or molar) ratio of B to A in the elpasolite actually produced.

Preferably, 2s/r is above 1.05 and more preferably still above 1.25 and even above 1.5. In particular, 2s/r can be above 1.15. More particularly, 2s/r can be above 1.35. In the case of an excessively large excess of B (excessively high 2s/r ratio), an unwanted phase can form, also giving rise to harmful inclusions. Preferably, the molar excess of B in the bath (and therefore the 2s/r ratio) is insufficient to generate the formation of a phase of $B_3C_{(1-y)}M_yX_6$ at the start of crystallization, and at the very least it is low enough to generate said formation as little as possible. Thus, 2s/r is preferably below 10 and more preferably still below 5. In particular, 2s/r can be below 3.

The 2s/r ratio is calculated from the molar quantities of A and B introduced into the bath. The elements A and B are introduced to it in halogenated form. For the case in which the bath contains K or Na, given that these elements can go to A-type sites or to B-type sites, it is advisable to determine the proportion of these elements going to the A sites and the B sites by experiment, in order to then be able to calculate the 2s/r ratio. To determine the proportion of Na and K found on one or the other site, a structural study can be carried out using X-ray diffraction. To do this, a sealed sample holder is used, preventing the powder from hydrating in contact with the ambient air and therefore becoming damaged. Indeed, these materials are very strongly hygroscopic. According to this disclosure, the excess of Na or K as B-type element is therefore determined a posteriori from the exact formula of the elpasolite finally produced by determining the relative percentage of Na or K on the A-type site or the B-type site. In general, the Na will predominantly go to the B-type site. By way of example, if a crystallization has been conducted from a bath containing 1.7 moles of CsCl, 1.5 moles of LiCl, 0.5 moles of NaCl and 2 moles of $YCl_3$, and that the Na contained in the elpasolite actually crystallized is at 80% on the B-type sites and at 20% on the A sites, then the 0.5 moles of Na can be virtually broken down in the bath into 0.1 moles of NaCl of ACl type and 0.4 moles of NaCl of BCl type. The bath therefore contains 1.8 moles of ACl (1.7 moles of CsCl+0.1 moles of NaCl), 1.9 moles of BCl (1.5 moles of LiCl+0.4 moles of NaCl) and 2 moles of $Ycl_3$. The 2s/r ratio is therefore of 2.1.

The components carrying A, B, C and M are present in the melt bath in the form of halide, the halogen of which corresponds to the X of the formula (1). Several different X halogens can be present in the melt bath if the final crystal must contain different X halogens. If t represents the number of moles of C in the melt bath, and if u represents the number of moles of M in the melt bath, then preferably, the ratio $2(t+u)/r$ is in the range extending from 0.8 to 1.2. Preferably, $u/(t+u)$ is below 0.1. In particular, u can be zero.

The crystalline elpasolite obtained by the process according to this disclosure can have a real formula that is very close to theoretical stoichiometry. This real formula can be represented by the formula:

$$A_a B_b C_c M_m X_x \quad (2)$$

in which A,B,C,M and X have the significance given previously, and a,b,c,m and x represent the respective atomic fractions of the A,B,C,M and X atoms. The atomic ratio $2b/a$ is in the range extending from 0.97 to 1.4 (the limits are therefore included in the range), this $2b/a$ ratio being generally below 1.2.

The crystal according to this disclosure is in the majority of cases of face-centered cubic elpasolite crystalline structure of space group "Fm$\bar{3}$m". With the convention that the sum of the atomic fractions of the cations (i.e. $a+b+c+m$) is equal to 4, generally, a is in the range extending from 1.7 to 2.3, b is in the range extending from 0.8 to 1.2, c is in the range extending from 0.85 to 1.1, m is in the range extending from 0 to 0.05 and x is in the range extending from 5.05 to 6.9.

In the process according to this disclosure, the excess of B is preferably enough for the ratio of the double of the atomic fraction of the B-type element to the atomic fraction of the A-type element (therefore the $2b/a$ ratio in formula (2)) in the elpasolite actually produced to be of at least 0.97.

In the formulae (1) and (2), A can be a mixture of several elements chosen from among Cs, Rb, K and Na. Similarly, B can be a mixture of several elements chosen from among Li, K or Na. This disclosure more particularly relates to cases where B comprises Li. More particularly, B is simply Li. Similarly, C can be a mixture of several elements chosen from among the rare earths (which includes Sc and Y), Al and Ga. Similarly, M can be a mixture of several elements chosen from among the alkaline earths, particularly a mixture of several elements chosen from among Ca, Mg, Sr or Ba. Equally, X can be a mixture of several elements chosen from among F, Cl, Br and I. In particular, X comprises Cl, Br and I.

In particular cases, A comprises Cs, B comprises Li and X comprises Cl or Br. In a more particular case, A comprises Cs, B comprises Li, C comprises La and X comprises Br. In another more particular case, A comprises Cs, B comprises Li, C comprises Y and X comprises Cl.

The rare earth is an element of the Lanthanides from La to Lu, or Sc or Y (these last two elements are similar to rare earths). In particular cases, C comprises a rare earth chosen from among the Lanthanides from La to Lu, or Y. The elpasolite is doped by an activating element conferring or improving its scintillation behavior. The activating element is at least a rare earth chosen from among Ce, Pr, Eu, Tb and Nd. It can be a mixture of activators, notably Ce and Pr. The activating element is part of the elements of C type. In general, the activator C" is present with a lower atomic fraction c" in the elpasolite than another element C' also of C type, notably Y, said element C' being present with the atomic fraction c'. If C represents a mixture of two elements C' and C" (notably Y and Ce respectively), then the atomic fraction c of the C-type element is such that $c=c'+c''$. The atomic fraction c" of the activating element C" is such that $c''/(c+m)$ is above 0.00001 and below or equal to 0.1, c representing the atomic fraction of element C (which includes all the C-type elements, therefore the element C') and m being the atomic fraction of element M. The elements C and M occupy the same sites in the crystal lattice of the elpasolite. The elpasolite can also contain a mixture of activators, notably Ce and Pr. In this case, the elpasolite contains three C-type elements (all on C-type sites), C', C" and C''' (for example specifically Y, Ce and Pr respectively), the latter element being present with the atomic fraction c'''. In this case, $(c''+c''')/(c+m)$ is above 0.00001 and below or equal to 0.1. The presence of M in the elpasolite, notably Sr, modifies the viscosity, the melting temperature of the mixture to be melted, the infra-red emissivity of the melt bath and the surface tension of the melt bath. The presence of M in the crystal, particularly Sr, can modify its scintillation properties such as its light output and its energy resolution.

This disclosure more particularly relates to scintillator materials of formulae (1) and (2) above for which B comprises Li, X comprises Cl, Br or I, and C comprises a rare earth chosen from among the Lanthanides from La to Lu, or Y, the scintillator material being doped with an element that will activate its scintillation. The materials of formulae (1) and (2) above can notably be such that B is Li, X is chosen from among Cl, Br or I, and C is chosen from among the Lanthanides from La to Lu, or Y, the scintillator material being doped with an element that will activate its scintillation. Notably, the material according to the present disclosure may not comprise fluoride. Scintillator materials produced according to the present disclosure can have a high light output, particularly measured with a gamma excitation of 662 keV. Notably, the light output can be above 15000 photons/MeV. A material rich in $LaBr_3$, such as CLLB, can have a light output above 25000 photons/MeV.

Scintillator materials produced according to this disclosure can have an excellent energy resolution (small full width at half-maximum of the scintillation peak). Scintillation measurements can be performed with a source of gamma rays of $^{137}$Cs type, a photomultiplier, and a standard measurement subsystem. Scintillator materials produced according to the present disclosure can have an energy resolution below 6%, or even below 5%, values measured with a source of $^{137}$Cs gamma rays. This disclosure more particularly relates to cases where in the formulae (1) and (2) B comprises Li. This disclosure more particularly relates to cases where in the formulae (1) and (2) A comprises Cs, and B comprises Li. This disclosure more particularly relates to cases where in the formulae (1) and (2) A comprises Cs, B comprises Li and C comprises La. This disclosure more particularly relates to cases where in the formulae (1) and (2) A comprises Cs, B comprises Li, C comprises La and X comprises Br, and particularly when X is at over 80% in moles Br (80% in moles of X is Br).

This disclosure more particularly relates to cases where in the formulae (1) and (2) A comprises Cs, B comprises Li and C comprises Y. This disclosure more particularly relates to cases where in the formulae (1) and (2) A comprises Cs, B comprises Li, C comprises Y and X comprises Cl, particularly when X is at over 80% in moles Cl (80% in moles of X is Cl).

The elpasolite can notably be of theoretical composition:
doped or undoped $Cs_2LiYCl_6$ and particularly $Cs_2LiYCl_6$:Ce, a component usually called "CLYC" by those skilled in the art;
doped or undoped $Cs_2LiLaBr_6$, and particularly $Cs_2LiLaBr_6$:Ce, a component usually called "CLLB" by those skilled in the art;

doped or undoped $Cs_2LiLaBr_{6(1-z)}Cl_{6z}$ with z ranging from 0 to 1, and particularly $Cs_2LiLaBr_{6(1-z)}Cl_{6z}$:Ce;

doped or undoped $Cs_2LiLaCl_6$ and particularly $Cs_2LiLaCl_6$:Ce a component usually called "CLLC" by those skilled in the art;

doped or undoped $Cs_2LiYBr_6$ and particularly $Cs_2LiYBr_6$:Ce a component usually called "CLYB" by those skilled in the art;

doped or undoped $Cs_2LiYF_6$ and particularly $Cs_2LiYF_6$:Ce, a component usually called "CLYF" by those skilled in the art;

doped or undoped $Cs_{2(1-z)}Rb_{2z}LiTRX_6$ and particularly $Cs_{2(1-z)}Rb_{2z}LiTRX_6$:Ce with z ranging from 0 to 1, TR representing a rare earth;

doped or undoped $Rb_2LiYX_6$ and particularly $Rb_2LiYX_6$:Ce;

$Cs_{2(1-z)}Rb_{2z}LiTRI_6$ with z ranging from 0 to 1, doped or undoped and particularly $Cs_{2(1-z)}Rb_{2z}LiTRI_6$:Ce, TR representing a rare earth, doped or undoped $Cs_2LiY_{(1-x)}La_xCl_6$ and particularly $Cs_2LiY_{(1-x)}La_xCl_6$:Ce.

Thus, the scintillator material of structure of the elpasolite type of theoretical composition $A_2BC_{(1-y)}M_yX_{(6-y)}$ and of real formula $A_aB_bC_cM_mX_x$ that can be fabricated by the process according to this disclosure can correspond to one of the cases below:

A is Cs, B is Li, C is a mixture of Y and Ce, and X is Cl;
A is Cs, B is Li, C is a mixture of La and Ce, and X is Br;
A is Cs, B is Li, C is a mixture of Y and Ce, and X is F;
A is Cs, B is Li, C is a mixture of La and Ce, and X is Cl;
A is a mixture of Cs and Rb, B is Li, C is a mixture of La and Ce, and X is Br;
A is Cs, B is Li, C is a mixture of La and Ce, and X is a mixture of Cl and Br;
A is Cs, B is Li, C is a mixture of Y and Ce, and X is a mixture of Cl and Br.
A is Cs, B is Li, C is a mixture of La, Y and Ce, and X is Cl;
A is a mixture of Cs and Na, B is a mixture of Li and Na, C is a mixture of Y and Ce, and X is Cl.

According to this disclosure, a substantial decrease or even the suppression of the formation of unwanted phases is obtained by producing the crystallization from a melt bath of composition offset with respect to the composition of the desired final crystal in the measure that it contains a molar excess of B with respect to the theoretical stoichiometry of the crystal. Moreover, the ratio of atomic fractions 2b/a (of formula (2)) is closer to the theoretical stoichiometric ratio of 1, or even greater than 1.

The growth is initiated from a melt bath, the composition of which does not correspond exactly to the stoichiometric composition of the elpasolite, nor to the desired final composition of the elpasolite. Generally, the process according to this disclosure is of the "auto-flux" type, i.e. the melt bath contains no chemical element not found at all in the crystal. If the liquid around or arriving around the crystal is not of homogenous composition, what counts is that the excess of B (i.e. 2s/r>1) exists for the part of the liquid in direct contact with the crystal. Indeed, the growth technique called "multi-crucible" according to which at least two crucibles are found nested one inside the other can be used to perform the process according to this disclosure, as soon as the liquid composition in the innermost crucible and in contact with the crystalline material satisfies the condition of the excess of B according to the invention.

The process according to this disclosure generally takes place in a crucible or a closed or even sealed phial. The crucible can particularly be made of graphite with a pyrolytic coating, or of vitreous carbon. The closed or even sealed phial is generally made of quartz or vitreous carbon or platinum.

According to this disclosure, the next step is to place the halogenated raw materials into a container (crucible, phial, etc.) in a non-oxidizing atmosphere, then to heat it until the raw materials melt, then the crystalline growth is carried out according to the chosen technique (Bridgman, Czochralski, etc.) and the container is cooled down to ambient temperature.

This disclosure can be conducted to result in a single crystal by using one of the techniques known to those skilled in the art such as those of Czochralski or Bridgman or Bagdasarov (horizontal Bridgman technique) or Kyropoulos or else the "Vertical Gradient Freeze" technique (crystallization by control of the thermal gradient) or else so-called EFG (Edge Feeding Growth) or the "continuous feeding" technique which covers the use of multi-crucibles, in particular the growth of crystals in a double crucible, one of the crucibles nesting in the other.

The elpasolite single crystal can have a volume above 10 $cm^3$ and even above 100 $cm^3$. Even if the ingot of monocrystalline growth contains inclusions, the monocrystalline part free of inclusions can have a volume above 10 $cm^3$ and even above 100 $cm^3$.

Notably, the process according to this disclosure can lead to an ingot whose first two-thirds in volume of growth of monocrystalline material comprise less than 10% in volume of any phase different to that of the elpasolite, which is noteworthy. In particular, in the case of a Czochralski monocrystalline growth process, the first two-thirds in volume of growth of monocrystalline material cannot contain any phase different to that of the elpasolite, which is also noteworthy.

It is also possible to prepare a polycrystal using the process according to this disclosure. To do this, it suffices to bring the mixture of raw materials to melting point and to cool the melted mass obtained without any particular precaution. Subsequently, it is possible to obtain the desired sizes of granulate by crushing or milling. It is also possible to obtain a crystalline powder by milling.

The raw materials used to produce the melt bath contain the elements entering into the composition of the elpasolite. This can for example involve a mixture of a halide of A, a halide of B, a halide of C and a halide of M. It then suffices to load an excess of B halide with respect to the intended stoichiometric composition for the final crystal. For the mixture of raw materials, this can also involve a mixture of several halides of which at least one comprises at least two of the elements A, B, C and M. Here again, it suffices to load an excess of the halide containing the element B, with respect to the intended stoichiometric composition.

Examples of components that can be used to form an excess of Li according to this disclosure are LiCl, $Li_3YCl_6$, $Cs_3Li_2Cl_5$, $Cs_2Li_3Cl_5$, and $Li_3LaBr_6$.

The process according to this disclosure translates into a crystalline growth as a consequence of a controlled cooling of a bath of a melted composition. This melted composition is obtained by melting one component or a mixture of components as raw material (this component or mixture of components being called precursor) resulting in the desired composition of the desired elements in the liquid bath. It is possible to use a single component of a composition corresponding exactly to that of the desired melt bath. It is also possible to use as raw material a mixture of halides of various elements entering into the desired composition.

Thus, if one desires to fabricate a CLYC, it is possible to mix a chloride of Cs, a chloride of Li, a chloride of Y and, where applicable, a chloride of Ce (in the case of a Ce doping).

The excess of B according to this disclosure does not completely go into the final crystalline material, and what does not go into it can be recovered as by-product after the solidification and notably re-used in the context of the process according to the invention. If the Czochralski process of monocrystalline growth is used, the remaining excess is found in the liquid phase remaining in the crucible. If the Bridgman process of monocrystalline growth is used, the remaining excess is found in a region comprising inclusions, said region forming mainly at the end of the process and being in any case of smaller proportion than in the absence of excess.

The excess of B according to this disclosure can make it possible to bring the composition of the final crystalline material closer to the perfect stoichiometric composition $A_2BC_{(1-y)}M_yX_{(6-y)}$. When a crystallization is produced from a bath of a composition corresponding exactly to that of the intended elpasolite crystal, the stoichiometric deficit is of the order of 2 to 3% in moles of B. To combat this deficit, this disclosure proposes to use an excess of B preferably of at least 5% in moles ($2s/r > 1.05$).

For a given elpasolite, there exists a minimum value of $2s/r$ at the level of the melt bath for which the first two-thirds in volume of ingot growth are entirely (100%) composed of said elpasolite. If t is the number of moles of C in the bath, then, the introduction into the bath of raw materials such that the $2t/r$ ratio above 1 and even above 1.08 and even above 1.1, or even of at least 1.2, makes it possible to reduce the minimum value of $2s/r$ for which the first two-thirds in volume of growth are entirely (100% in volume) composed of said elpasolite. For one and the same volume of usable elpasolite in the first two-thirds of the fabricated ingot, the increase in the $2t/r$ ratio makes it possible to reduce the $2s/r$ ratio. The increase in the $2t/r$ ratio can be produced by introducing into the melt bath components, particularly of the type $B_3CX_6$ (B, C and X having the significance given previously) such as $Li_3LaBr_6$ or $Li_3YCl_6$. This excess of C could also be produced by a larger quantity of $CX_3$. However, the use of components of $B_3CX_6$ type makes it possible to produce an excess both of B and C. This effect of the high $2t/r$ ratio on the ingot quality is particularly notable in the case of elpasolites for which C is at over 80% in moles Lanthane and X is at over 80% in moles Bromine (elpasolith "rich in $LaBr_3$"). If the $2t/r$ is higher, the perfect crystal yield is improved, particularly beyond the first two-thirds in volume of growth. In the case of a Bridgman growth, the quantity of unfit material is decreased at the end of growth (shaded part of FIG. 1c particularly). In the case of a Czochralski growth, less material is left in the bath when the growth is ended. Increasing $2t/r$ even makes it possible to reduce $2s/r$, for example to less than 1.65.

For the case of an elpasolite for which C comprises La, particularly if C is at over 80% in moles Lanthane and for which X comprises Br, particularly if X is at over 80% in moles Bromine, particularly in the case of an elpasolite of CLLB type, then the fact of having both $2t/r$ above 1 and even above 1.08 and even above 1.1, or even at least 1.2, concomitantly with the fact of having $2s/r$ above 1.05, or even at least 1.1 makes it possible to obtain a $2b/a$ of at least 1.1, or even of at least 1.15 or even of at least 1.2, up to 1.4 particularly.

Rare earth halide elpasolites are generally hygroscopic and handled in a suitable atmosphere, i.e. dry and neutral or reductive (hydrogenated nitrogen, argon, nitrogen, hydrogenated argon) or in a vacuum. This also applies to the measurement techniques used, which are to be performed in a suitable atmosphere, especially diffraction measurements. Diffraction measurements made in an unsuitable atmosphere (particularly ambient air) can falsify the measurements. The Bridgman process, which can make a crystallization occur in a vacuum-sealed phial (generally made of quartz or of vitreous carbon), is advantageous from this point of view, because the crystallization is easily achieved in a suitable atmosphere.

The temperature to which the melt bath is brought before crystallization depends on the formulation of the bath. In general, the bath is brought to between 400 and 1100° C. according to composition, before crystallization. In the context of a monocrystalline growth process, the cooling speeds are generally between 0.01° C./hour and 5° C./hour. In the Bridgman process, the translation speed of the crystal generally lies between 0.01 mm/h and 20 mm/h. If a polycrystal of the elpasolite phase is sought, the cooling speeds can be much faster, notably lying between 5 and 200° C./h.

FIG. 1 represents ingots taken out of their phial after crystalline growth of Bridgman type. Case a) corresponds to what is obtained in the prior art, i.e. a high volumetric level of unusable ingot because the ingot comprises many inclusions (shaded parts), notably at the start of the growth, which corresponds to the lower part of the ingot. This narrow part of the ingot is taken into account when expressing the result and therefore counts as volume of growth according to the invention. Case c) corresponds to the case according to the invention with a high level of usable single crystal. The shaded part at the top corresponds to an undesired phase. The case b) corresponds to an intermediate situation with an excess of B below that used in c), which has led to a higher level of inclusions.

FIG. 2 represents ingots after crystalline growth of Czochralski type. The narrow part in the upper region corresponds to the monocrystalline seed used to initiate the growth. This part is not taken into account when expressing the result. In a), the ingot is totally unusable because it is entirely polluted by inclusions and corresponds to the prior art, i.e. an absence of excess of B. In c), the ingot is perfect, devoid of inclusions. An excess of B according to the invention has been used. The case b) corresponds to an intermediate case between cases a) and c), with an excess of B below that used in c).

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A process for fabricating a crystalline scintillator material with a structure of elpasolite type of theoretical composition $A_2BC_{(1-y)}M_yX_{(6-y)}$ wherein:

A is chosen from among Cs, Rb, K, Na,

B is chosen from among Li, K, Na,

C is chosen from among the rare earths, Al, Ga,

M is chosen from among the alkaline earths,

X is chosen from among F, Cl, Br, I, y representing the atomic fraction of substitution of C by M and being in the range extending from 0 to 0.05, comprising its crystallization by cooling from a melt bath comprising r moles of A and s moles of B, characterized in that the crystalline scintillator material is doped with an element activating its scintillation and in that the melt bath in contact with the material contains A and B in such a way that 2s/r is above 1.

Embodiment 2. The process in the preceding embodiment, characterized in that 2s/r is above 1.05.

Embodiment 3. The process in the preceding embodiment, characterized in that 2s/r is above 1.15 and preferably above 1.25.

Embodiment 4. The process in the preceding embodiment, characterized in that 2s/r is above 1.35 and preferably above 1.5.

Embodiment 5. The process in one of the preceding embodiments, characterized in that 2s/r is below 10 and preferably below 5 and preferably below 3.

Embodiment 6. The process in one of the preceding embodiments, characterized in that 2s/r is enough for the ratio of the double of the atomic fraction of B-type element to the atomic fraction of the A-type element in the crystalline material to be of at least 0.97.

Embodiment 7. The process in one of the preceding embodiments, characterized in that M is chosen from among Ca, Mg, Sr or Ba.

Embodiment 8. The process in one of the preceding embodiments, characterized in that C comprises at least one activating rare earth chosen from among Ce, Pr, Eu, Tb and Nd, the atomic fraction of which is such that the ratio of its atomic fraction to the sum of the atomic fractions of elements C and M in the crystalline material is above 0.00001 and below or equal to 0.1.

Embodiment 9. The process in one of the preceding embodiments, characterized in that 2s/r is not enough to generate the formation of a phase of $B_3C_{(1-y)}M_yX_6$ at the start of the crystallization.

Embodiment 10. The process in one of the preceding embodiments, characterized in that B comprises Li.

Embodiment 11. The process in one of the preceding embodiments, characterized in that B is Li.

Embodiment 12. The process in one of the preceding embodiments, characterized in that X comprises Cl, Br or I.

Embodiment 13. The process in one of the preceding embodiments, characterized in that the rare earth comprises an element of the Lanthanides from La to Lu, or Y.

Embodiment 14. The process in one of the preceding embodiments, characterized in that A comprises Cs and B comprises Li.

Embodiment 15. The process in the preceding embodiment, characterized in that C comprises La and X comprises Br.

Embodiment 16. The process in one of the two preceding embodiments, characterized in that C is at over 80% in moles lanthanum and X is at over 80% in moles bromine.

Embodiment 17. The process in embodiment 14, characterized in that C comprises Y and X comprises Cl.

Embodiment 18. The process in the preceding embodiment, characterized in that C is at over 80% in moles Y and in that X is at over 80% in moles Cl.

Embodiment 19. The process in one of the preceding embodiments, characterized in that 2t/r is above 1, and even above 1.1 and even of at least 1.2, t representing the number of moles of C in the bath.

Embodiment 20. The process in one of embodiments 1 to 15, characterized in that 2t/r is above 1, and even above 1.1 and even of at least 1.2, t representing the number of moles of C in the bath, C comprises La, particularly with C at over 80% in moles La, and X comprises Br particularly with X at over 80% in moles Br, and 2s/r is above 1.05, or even at least 1.1.

Embodiment 21. The process in one of the preceding embodiments, characterized in that it is a monocrystalline growth process.

Embodiment 22. The process in the preceding embodiment, characterized in that the first two-thirds in volume of growth of the monocrystalline material comprise less than 10% in volume of phase different to that of the elpasolite.

Embodiment 23. The process in the preceding embodiment, characterized in that the crystallization is of Czochralski type in that the first two-thirds in volume of growth of the monocrystalline material do not contain any phase different to that of the elpasolite.

Embodiment 24. The process in one of the preceding embodiments, characterized in that the crystalline material is made from incongruent fusion.

Embodiment 25. A crystalline scintillator material doped with an element that activates its scintillation, of structure of elpasolite type of theoretical composition $A_2BC_{(1-y)}M_yX_{(6-y)}$ and of real formula $A_aB_bC_cM_mX_x$ wherein:

A is chosen from among Cs, Rb, K, Na,
B is chosen from among Li, K, Na,
C is chosen from among the rare earths, Al, Ga,
M is chosen from among the alkaline earths,
X is chosen from among F, Cl, Br, I,
y representing the atomic fraction of substitution of C by M and being in the range extending from 0 to 0.05, a, b, c, m, and x representing the respective atomic fractions of A, B, C, M, and X, the 2b/a ratio being in the range extending from 0.97 to 1.4.

Embodiment 26. The material in the preceding embodiment, characterized in that C contains at least one activating rare earth chosen from among Ce, Pr, Eu, Tb, and Nd, the atomic fraction of which is such that the ratio of its atomic fraction to the sum of the atomic fractions of elements C and M is above 0.00001 and below or equal to 0.1.

Embodiment 27. The material in one of the preceding material embodiments, characterized in that B comprises Li.

Embodiment 28. The material in the preceding embodiment, characterized in that A comprises Cs.

Embodiment 29. The material in the preceding embodiment, characterized in that C comprises La and X comprises Br.

Embodiment 30. The material in the preceding embodiment, characterized in that C is at over 80% in moles lanthanum and X is at over 80% in moles bromine.

Embodiment 31. The material in embodiment 27 or 28, characterized in that C comprises Y and X comprises Cl.

Embodiment 32. The material in the preceding embodiment, characterized in that C is at over 80% in moles Y and in that X is at over 80% in moles Cl.

Embodiment 33. The material in one of the preceding material embodiments, characterized in that X comprises Cl, Br or I.

Embodiment 34. The material in one of embodiments 25 to 28, characterized in that C comprises a rare earth chosen from among the Lanthanides from La to Lu, or Y.

Embodiment 35. The material in one of embodiments 25 and 26, characterized in that A is Cs, B is Li, C is a mixture of Y and Ce, and X is Cl.

Embodiment 36. The material in one of embodiments 25 and 26, characterized in that A is Cs, B is Li, C is a mixture of La and Ce, and X is Br.

Embodiment 37. The material in one of embodiments 25 and 26, characterized in that A is Cs, B is Li, C is a mixture of La and Ce, and X is Cl.

Embodiment 38. The material in one of embodiments 25 and 26, characterized in that A is a mixture of Cs and Rb, B is Li, C is a mixture of La and Ce, and X is Br.

Embodiment 39. The material in one of embodiments 25 and 26, characterized in that A is Cs, B is Li, C is a mixture of La and Ce, and X is a mixture of Cl and Br.

Embodiment 40. The material in one of embodiments 25 and 26, characterized in that A is Cs, B is Li, C is a mixture of Y and Ce, and X is a mixture of Cl and Br.

Embodiment 41. The material in one of embodiments 25 and 26, characterized in that A is Cs, B is Li, C is a mixture of La, Y and Ce, and X is Cl.

Embodiment 42. The material in one of embodiments 25 and 26, characterized in that A is a mixture of Cs and Na, B is a mixture of Li and Na, C is a mixture of Y and Ce and X is Cl.

Embodiment 43. The material in one of embodiments 25 and 26, characterized in that A is Cs, B is Li, C is a mixture of Y and Ce, and X is F.

Embodiment 44. The material in one of embodiments 29, 30 or 39, characterized in that the 2b/a ratio is in the range extending from 1.1 to 1.4.

Embodiment 45. The material in one of embodiments 25 to 44, characterized in that the crystalline material is made from incongruent fusion.

Embodiment 46. The material in one of the preceding material embodiments, characterized in that its scintillation energy resolution is below 6%, or even below 5%, measured with a source of $^{137}$Cs gamma rays of 662 keV.

Embodiment 47. An ingot of monocrystalline growth comprising a material of one of the preceding material embodiments, characterized in that the first two-thirds in volume of growth comprise less than 10% in volume of phase different to that of the elpasolite material.

Embodiment 48. The ingot in the preceding embodiment, characterized in that the first two-thirds in volume of growth of the monocrystalline material do not contain any phase different to that of the elpasolite material.

EXAMPLES

Powder mixtures are produced of raw materials of the type of halides of the cations to be inserted into the elpasolite.

Single crystals are produced by crystallization from melt baths, the compositions of which are listed in table 1. The examples are according to this disclosure or are comparative and include in the latter case the annotation "comp". The composition of the bath can be expressed globally or by presenting it in the form of the sum of a stoichiometric elpasolite and the component or components put in excess, comprising B. In this table, BG means that a growth of Bridgman type has been used and CZ means that a growth of Czochralski type has been used. In the case of example 8, the sodium being able to go to the sites of the Cs or of the Li, it was noticed a posteriori that in the final crystal the proportion of Na on the Li sites was of 89% and the proportion of Na on the Cs sites was of 11%. This is why, for 2 moles of Cs introduced into the bath, the quantity of A in the bath is of 2 (for the Cs)+0.074 (for 11% of 0.67 moles of Na) or 2.074 moles. The quantity of B in the bath is of 1 (for the Li)+0.596 (for 89% of 0.67 moles of Na) or 1.596 moles. The 2s/r ratio is therefore here of (2×1.596)/2.074=1.54.

In the case of a growth of the CZ type, not all the bath used is transformed into ingot material, in a manner inherent to this technique. On the contrary, in Bridgman crystallization, all the bath used has solidified into the ingot. In the last column of table 1, the percentage of really usable single crystal in the first two-thirds of growth of the solidified ingot is given. In CZ growth it is therefore not a question of a percentage of the material used in the bath. On the other hand, in Bridgman growth, it is also a question of a percentage of the material used in the bath. Examples 20, 21, 22, 24 show that, in the case of CLLB, a high 2s/r ratio in the bath leads to a 2b/a distinctly above 1 in the elpasolite.

TABLE 1

| Ex n° | Type of growth | Melt bath composition | 2s/r bath | 2t/r bath | Crystal composition obtained | 2b/a Final crystal | % vol usable first 2/3 of ingot |
|---|---|---|---|---|---|---|---|
| 1 (comp) | BG | $Cs_2Li_1Y_{0.995}Cl_6:Ce_{0.005}$ | 1 | 1 | $Cs_{2.035}Li_{0.982}Y_{0.982}Cl_{5.966}:Ce_{0.001}$ | 0.965 | 84 |
| 2 (comp) | BG | $Cs_2Li_1Y_1Cl_6$ | 1 | 1 | $Cs_{2.046}Li_{0.972}Y_{0.982}Cl_{5.964}$ | 0.95 | 82 |
| 3 (comp) | CZ | $Cs_2Li_1Y_1Cl_6$ | 1 | 1 | — | | 0 |
| 4 | CZ | $Cs_2Li_{1.67}Y_{0.995}Cl_{6.67}:Ce_{0.005}$ or $Cs_2Li_1Y_{0.995}Cl_6:Ce_{0.005}$ + 0.67 LiCl | 1.67 | 1 | $Cs_{1.997}Li_{0.998}Y_{1.004}Cl_{6.01}:Ce_{0.001}$ | 0.999 | 100 |
| 5 | BG | $Cs_2Li_{1.249}Y_{1.078}Cl_{6.489}:Ce_{0.005}$ or $Cs_2Li_1Y_{0.995}Cl_6:Ce_{0.0005}$ + 0.083 $Li_3YCl_6$ | 1.25 | 1.083 | $Cs_{2.015}Li_{0.996}Y_{0.988}Cl_{5.978}:Ce_{0.001}$ | 0.989 | 100 |
| 6 | BG | $Cs_2Li_{1.56}Y_{0.995}La_{0.1}Ce_{0.005}Cl_{6.86}$ or $Cs_2Li_1Y_{0.995}Cl_6:Ce_{0.005}$ + 0.56 LiCl + 0.1 $LaCl_3$ | 1.56 | 1.1 | $Cs_{2.006}Li_{0.995}La_{0.008}Y_{0.989}Cl_{5.998}:Ce_{0.002}$ | 0.992 | 100 |
| 7 | BG | $Cs_2Li_{1.66}Y_{0.995}Cl_{6.66}:Ce_{0.005}$ or $Cs_2Li_1Y_{0.995}Cl_6:Ce_{0.005}$ + 0.66 LiCl | 1.66 | 1 | $Cs_{2.005}Li_{0.995}Cl_{5.74}:Ce_{0.001}$ | 0.993 | 100 |
| 8 | BG | $Cs_2Li_1Na_{0.67}Y_{0.995}Ce_{0.005}Cl_{6.67}$ or $Cs_2Li_1Ce_{0.005}Y_{0.995}Cl_6$ + 0.67 NaCl | 1.67 | 1 | $Cs_{1.91}Li_{0.467}Na_{0.599}Y_{1.022}Cl_{6.048}:Ce_{0.02}$ or $(Cs_{1.91}Na_{0.066})(Li_{0.467}Na_{0.533})(Y_{1.022}Ce_{0.002})Cl_{6.048}$ | 1.012 | 100 |

TABLE 1-continued

| Ex n° | Type of growth | Melt bath composition | 2s/r bath | 2t/r bath | Crystal composition obtained | 2b/a Final crystal | % vol usable first 2/3 of ingot |
|---|---|---|---|---|---|---|---|
| 9 | CZ | $Cs_2Li_{1.67}Y_{0.995}Ca_{0.003}Ce_{0.005}Cl_{6.676}$ or $Cs_2LiY_{0.995}Ce_{0.005}Cl_6$ + 0.67 LiCl + 0.003 $CaCl_2$ | 1.67 | 1 | $Cs_{2.018}Li_{1.006}Ca_{0.001}Y_{0.974}Cl_{5.951}$: $Ce_{0.001}$ | 0.997 | 100 |
| 10 | BG | $Cs_2Li_{1.67}Y_{0.995}Sr_{0.003}Ce_{0.005}Cl_{6.676}$ or $Cs_2LiY_{0.995}Ce_{0.005}Cl_6$ + 0.67 LiCl + 0.003 $SrCl_2$ | 1.67 | 1 | $Cs_{2.005}Li_{1.071}Sr_{0.001}Y_{0.921}C_{l5.847}$: $Ce_{0.002}$ | 1.068 | 100 |
| 11 (comp) | CZ | $Cs_2LiLa_{0.98}Ce_{0.02}Br_6$ | 1 | 1 | — | | 0 |
| 12 | CZ | $Cs_2Li_{1.8}La_{0.99}Ce_{0.01}Br_{6.8}$ or $Cs_2Li_1La_{0.99}Ce_{0.01}Br_6$ + 0.8 LiBr | 1.8 | 1 | $Cs_{2.009}Li_{1.01}La_{0.98}Br_{5.97}$: $Ce_{0.001}$ | 1.005 | 100 |
| 13 (comp) | BG | $Cs_2Li_1Y_{0.995}Ce_{0.005}Br_6$ | 1 | 1 | $Cs_{2.025}Li_{0.978}Y_{0.995}Br_{5.994}$: $Ce_{0.002}$ | 0.966 | 100 |
| 14 | BG | $Cs_2Li_{1.1}Y_{0.995}Ce_{0.005}Br_6$ or $Cs_2Li_1Y_{0.995}Ce_{0.005}Br_6$ + 0.1 LiBr | 1.1 | 1 | $Cs_{2.001}Li_{1.006}Y_{0.991}Br_6$: $Ce_{0.002}$ | 1.005 | 100 |
| 15 (comp) | BG | $Rb_2LiY_{0.99}Ce_{0.01}Br_6$ | 1 | 1 | $Rb_{2.027}Li_{0.976}Y_{0.996}Br_{5.994}$: $Ce_{0.001}$ | 0.963 | 76 |
| 16 | BG | $Rb_2Li_{1.7}Y_{0.99}Ce_{0.001}Br_{6.7}$ or $Rb_2LiY_{0.99}Ce_{0.01}Br_6$ + 0.7 LiBr | 1.7 | 1 | $Rb_{2.005}Li_{1.005}Y_{0.989}Br_{5.98}$: $Ce_{0.001}$ | 1.002 | 92 |
| 17 | BG | $Cs_2Li_{1.60}Y_{0.9965}F_{6.6}$:$Ce_{0.0035}$ or $Cs_2Li_1Y_{0.9965}F_6$:$Ce_{0.0035}$ + 0.6 LiF | 1.6 | 1 | $Cs_{1.994}Li_{0.997}Y_{1.007}F_{6.018}$: $Ce_{0.002}$ | 1.017 | 100 |
| 18 | CZ | $Cs_2Li_{1.6}La_{0.98}Ce_{0.02}Br_6Cl_{0.6}$ or $Cs_2Li_1La_{0.98}Ce_{0.02}Br_6$ + 0.6 LiCl | 1.6 | 1 | $Cs_{1.961}Li_{1.051}La_{0.987}Br_{5.976}Cl_{0.051}$: $Ce_{0.001}$ | 1.072 | 100 |
| 19 | CZ | $Cs_2Li_{1.6}Y_{1.195}Cl_{7.2}$:$Ce_{0.005}$ or $Cs_2Li_1Y_{0.995}Cl_6$:$Ce_{0.005}$ + 0.2 $Li_3YCl_6$ | 1.6 | 1.2 | $Cs_2Li_{1.001}Y_{0.998}Cl_{5.998}$: $Ce_{0.001}$ | 1.001 | 100 |
| 20 | BG | $Cs_2Li_{1.36}La_{1.118}Ce_{0.002}Br_{6.72}$ or $Cs_2Li_1La_{0.998}Ce_{0.002}Br_6$ + 0.12 $Li_3LaBr_6$ | 1.36 | 1.12 | $Cs_{1.884}Li_{1.113}La_{0.972}Ce_{0.031}Br_{6.006}$ | 1.181 | 100 |
| 21 | BG | $Cs_2Li_{1.5}La_{1.13}Ce_{0.02}Br_{6.9}I_{0.05}$ or $Cs_2Li_1La_{0.98}Ce_{0.02}Br_6$ + 0.15 $Li_3LaBr_6$ + 0.05 LiI | 1.5 | 1.15 | $Cs_{1.842}Li_{1.133}La_{0.996}Ce_{0.029}Br_{5.53}I_{0.52}$ | 1.23 | 100 |
| 22 | BG | $Cs_2Li_{1.5}La_{1.13}Ce_{0.02}Br_{6.95}$ or $Cs_2Li_1La_{0.98}Ce_{0.02}Br_6$ + 0.15 $Li_3LaBr_6$ + 0.05 LiBr | 1.5 | 1.15 | $Cs_{1.842}Li_{1.124}La_{1.004}Ce_{0.03}Br_{6.068}$ | 1.22 | 100 |
| 24 | BG | $Cs_2Li_{1.5}La_{1.08}Ce_{0.02}Br_{6.8}$ or $Cs_2Li_1La_{0.98}Ce_{0.02}Br_6$ + 0.1 $Li_3LaBr_6$ + 0.2 LiBr | 1.5 | 1.1 | $Cs_{1.861}Li_{1.132}La_{0.976}Ce_{0.031}Br_{6.014}$ | 1.22 | 100 |
| 25 | BG | $Cs_2Li_{1.55}Y_{1.098}Ce_{0.002}Cl_{6.85}$ or $Cs_2Li_1Y_{0.998}Ce_{0.002}Cl_6$ + 0.1 $Li_3YCl_6$ + 0.25 LiCl | 1.55 | 1.1 | $Cs_{1.991}Li_{1.047}Y_{0.930}Ce_{0.032}Cl_{5.924}$ | 1.05 | 100 |
| 26 | BG | $Cs_2Li_{1.453}Y_{1.148}Ce_{0.002}Sr_{0.003}Cl_{6.906}$ or $Cs_2Li_1Y_{0.998}Ce_{0.002}Cl_6$ + 0.15 $Li_3YCl_6$ + 0.003 $SrCl_2$ | 1.45 | 1.15 | $Cs_{1.98}Li_{1.026}Sr_{0.001}Y_{0.992}Ce_{0.001}Cl_{5.988}$ | 1.04 | 100 |
| 27 | BG | $Cs_2Li_{1.45}Y_{1.148}Ce_{0.002}Cl_{6.9}$ or $Cs_2Li_1Y_{0.998}Ce_{0.002}Cl_6$ + 0.15 $Li_3YCl_6$ | 1.45 | 1.15 | $Cs_{1.944}Li_{1.054}Y_{1.001}Ce_{0.001}Cl_{6.004}$ | 1.08 | 100 |
| 28 | CZ | $Cs_2Li_{1.3}Y_{1.098}Ce_{0.002}Cl_{6.6}$ or $Cs_2Li_1Y_{0.998}Ce_{0.002}Cl_6$ + 0.1 $Li_3YCl_6$ | 1.3 | 1.1 | $Cs_{2.041}Li_1Y_{0.958}Ce_{0.001}Cl_{5.918}$ | 0.98 | 100 |

Table 2 gives the scintillation properties of certain crystals already described in table 1. It indicates the relative light output (column LO for "light output") measured with a gamma excitation of 662 keV, and the energy resolution (full width at half-maximum of the scintillation peak). The scintillation measurements were performed with a source of gamma rays of $^{137}Cs$ type, a photomultiplier and a standard measurement subsystem. The values obtained can be compared with each other because they are determined with a determined sample geometry and with the same measuring instruments. The lower the value of the energy resolution, the better it is. The light output is preferably as high as possible. For crystals of CLYC type, the light output has been expressed relative to that of example 1 (LO evaluated at 1 arbitrarily). For crystals of CLLB type, the light output has been expressed relative to that of example 11 (LO evaluated at 1 arbitrarily).

TABLE 2

| | Relative LO | Energy resolution |
|---|---|---|
| CLYC ex 1 (reference) | 1 | 6.19% |
| CLYC ex 4 | 1.15 | 4.61% |
| CLYC ex 5 | 1.28 | 5.15% |
| CLYC ex 7 | 1.20 | 4.67% |
| CLLB ex 11 (reference) | 1 | 8.73% |
| CLLB ex 12 | 1.20 | 4.14% |

FIGS. 1a) and 1c) represent phials after crystalline growth of Bridgman type according to the examples. Examples 1, 2 and 15 resulted in an ingot of the type of that in FIG. 1a). Examples 5, 6, 7, 8, 10, 13, 14 and 17 resulted in an ingot of the type of that in FIG. 1c). For these examples 5, 6, 7, 8, 10, 13, 14, 17 the first two-thirds in volume of the monocrystalline material growth comprise less than 10% in volume of any phase different to that of the elpasolite. In these specific cases, the volume of impure phase is at 0%.

In the case of examples 15 and 16, it is shown that the first two-thirds in volume of any phase different to the elpasolite phase can be lowered from 24% to 8% using the invention. Example 16 therefore results in an ingot of the type in FIG. 1b) or the first two-thirds in volume of monocrystalline material growth comprise less than 10% in volume of any phase different to that of the elpasolite but more than 0%.

FIGS. 2a) et 2c) represent ingots after crystalline growth of the Czochralski type according to the examples. Examples 3 and 11 resulted in an ingot of the type of that in FIG. 2a). Examples 4, 9, 12, 18 and 19 resulted in an ingot of the type of that in FIG. 2c). For these examples 4, 9 and 12, 18, and 19 the 100% in volume of growth of the monocrystalline material do not contain any phase different to that of the elpasolite.

It can indeed be seen that the examples according to this disclosure using an excess of B (or 2s/r>1) give rise to far fewer inclusions and therefore to a better single crystal fabrication yield. They also give rise to better scintillation performance.

In the case of examples 5, 6, 19, 20, 21, 22, 24, 25, 26, 27, and 28, the 2t/r in the bath was above 1 and the 2s/r in the bath was above 1.08. In these cases, a corresponding growth was observed, according to its type, in FIGS. 1c or 2c, the perfect crystal yield being increased. In the case of a Bridgman growth, it is the shaded part of FIG. 1c that was reduced. In the case of a Czochralski growth, it is the quantity of material remaining in the bath that was reduced. In the case of examples 7 and 27 the percentage of the mass of the unwanted phase at the end of the growth was measured (shaded part of FIG. 1c) out of the total mass of material introduced into the Bridgman phial. It was observed that this percentage is distinctly lower in the case of example 27 (10%) with respect to that of example 7 (17.9%). The material yield is much higher in the case of example 27 compared to example 7.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A detector, comprising a scintillator including a crystalline scintillator material, wherein the crystalline scintillator material includes a compound $A_aB_bC_cM_mX_x$, wherein:
   A comprises Cs, Rb, K, Na, or a combination thereof;
   B comprises Li, K, or Na, A being different from B;
   C comprises a rare earth element, Al, or Ga;
   M comprises an alkaline earth element; and
   X comprises a halogen,
   a, b, c, m, and x represent respective atomic fractions of A, B, C, M, and X, and a sum of a, b, c, and m is 4,
   $1.7 \leq a \leq 2.3$;
   $0.8 \leq b \leq 1.2$;
   $0.85 \leq c \leq 1.1$;
   $0 \leq m \leq 0.05$;
   $5.05 \leq x \leq 6.9$;
   a 2b/a ratio is in a range from 0.97 to 1.4.

2. The detector of claim 1, wherein m>0, and wherein M includes Ca, Mg, Sr, Ba, or a combination thereof.

3. The detector of claim 1, wherein C comprises at least one activating rare earth element including Ce, Pr, Eu, Tb, or Nd, wherein a ratio of an atomic fraction of the at least one activating rare earth element to a sum of c and m is above 0.00001 and below or equal to 0.1.

4. The detector of claim 1, wherein B comprises Li.

5. The detector of claim 1, wherein B is Li.

6. The detector of claim 1, wherein A comprises Cs, B comprises Li, and X comprises Cl or Br.

7. The detector of claim 1, wherein A comprises Cs, B comprises Li, C comprises La, and X comprises Br.

8. The detector of claim 1, wherein A comprises Cs, B comprises Li, C comprises Y, and X comprises Cl.

9. The detector of claim 1, wherein A is Cs, B is Li, C is a mixture of Y and Ce, and X is Cl.

10. The detector of claim 9, wherein m>0, and wherein M is Sr.

11. The detector of claim 1, wherein A is Cs, B is Li, C is a mixture of La and Ce, and X includes Br, Cl, or a combination thereof.

12. The detector of claim 1, wherein A is Cs, B is Li, C is a mixture of La and Ce, and X is Br.

13. The detector of claim 1, wherein A is Cs, B is Li, C is a mixture of La and Ce, and X is a mixture of Br and Cl.

14. The detector of claim 1, wherein A is Cs, B is Li, C is a mixture of La, Y, and Ce, and X is Cl.

15. The detector of claim 1, wherein A is Cs, B is a mixture of Li and Na, C is a mixture of Y and Ce, and X is Cl.

16. The detector of claim 1, wherein A is Cs, B is Li, C is a mixture of Y and Ce, and X is F.

17. The detector of claim 1, wherein A is Cs, B is Li, C is a mixture of La and Ce, and X includes Br, Cl, or a combination thereof.

18. The detector of claim 1, wherein the 2 b/a ratio is in the range from 1.1 to 1.4.

19. The detector of claim 1, further comprising a photomultiplier tube, a photodiode, a silicon photomultiplier, or an avalanche photodiode.

20. The detector of claim 1, wherein the crystalline scintillator material has a scintillation energy resolution below 6%, measured with a source of $^{137}$Cs gamma rays of 12keV.

* * * * *

UNITED STATES PATENT AND TRADEMARK OFFICE
CERTIFICATE OF CORRECTION

PATENT NO. : 10,180,503 B2
APPLICATION NO. : 15/960061
DATED : January 15, 2019
INVENTOR(S) : Vladimir Ouspenski et al.

Page 1 of 1

It is certified that error appears in the above-identified patent and that said Letters Patent is hereby corrected as shown below:

In the Specification

Column 13, Table 1, row 5, column "Melt bath composition", please delete "$Cs_2Li_1Y_{0.995}Cl_6:Ce_{0.0005}$", and insert --$Cs_2Li_1Y_{0.995}Cl_6:Ce_{0.005}$--

Column 14, Table 1, row 7, column "Crystal composition obtained", please delete "$Cs_{2.005}Li_{0.995}Cl_{5.74}:Ce_{0.001}$", and insert --$Cs_{2.005}Li_{0.995}Y_{0.999}Cl_{5.74}:Ce_{0.001}$--

Column 16, Table 1, row 10, column "Crystal composition obtained" please delete "$CS_{2.005}Li_{1.071}Sr_{0.001}Y_{0.921}C_{15.847}:Ce_{0.002}$", and insert --$CS_{2.005}Li_{1.071}Sr_{0.001}Y_{0.921}Cl_{15.847}:Ce_{0.002}$--

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*